METHODS OF ASSEMBLING COMPONENTS WITH PRINTED CIRCUITS

Filed Jan. 3, 1963 4 Sheets-Sheet 1

INVENTORS
H.F. BLAIR
D.F. THOMAS
BY S. Gundersen
ATTORNEY

METHODS OF ASSEMBLING COMPONENTS WITH PRINTED CIRCUITS

Filed Jan. 3, 1963 4 Sheets-Sheet 2

INVENTORS
H.F. BLAIR
D.F. THOMAS
BY S. Gundersen
ATTORNEY

METHODS OF ASSEMBLING COMPONENTS WITH PRINTED CIRCUITS

INVENTORS
H.F. BLAIR
D.F. THOMAS
BY S. Gundersen
ATTORNEY

METHODS OF ASSEMBLING COMPONENTS WITH PRINTED CIRCUITS

Filed Jan. 3, 1963

INVENTORS
H.F. BLAIR
D.F. THOMAS
BY S. Gundersen
ATTORNEY

United States Patent Office 3,340,608

Patented Sept. 12, 1967

3,340,608

METHODS OF ASSEMBLING COMPONENTS WITH PRINTED CIRCUITS

Harold F. Blair, Worthington, and Donald F. Thomas, Upper Arlington, Ohio, assignors to Western Electric Company, Incorporated, New York, N.Y., a corporation of New York

Filed Jan. 3, 1963, Ser. No. 249,181

3 Claims. (Cl. 29—626)

This invention relates to methods of assembling components with printed circuits and particularly relates to the mass assembly of terminals of units with printed circuits.

In the manufacture of electrical units having terminals which are to be interconnected, considerable time is involved in the assembling of interconnecting surface wires and the securing of the wires to the terminals. To alleviate the time-consuming problem, printed circuits are used to provide the circuit connections previously maintained by the surface wiring. In a manufacturing system where a mass of such units have to be assembled with printed circuits, an additional time consuming and expensive operation is involved in the formation of apertures in land areas of the printed circuit for the reception of the terminals of the units. Additionally, the component terminals are usually clinched beneath a board supporting the printed circuit to retain the components with the board for subsequent securing operations.

It is, therefore, and object of this invention to provide new and improved methods for assembling units with printed circuits.

Another object of this invention is to provide new and improved methods of mass assembling of terminals of units with printed circuit panels without requiring bending of the terminals beneath the panel for a subsequent securing operation.

With these objects in view, the present invention contemplates utilizing terminals of units to be assembled to a printed circuit panel to punch holes through corresponding conductive land areas of the printed circuit as well as the carrier for the circuit so that the terminals will be frictionally secured in the punched holes in the carrier and the circuit, thereby electrically connecting the terminals with the circuit.

Other objects, advantages and novel aspects of the invention become apparent upon consideration of the following detailed description in conjunction with the accompanying drawings in which.

Figure 1:
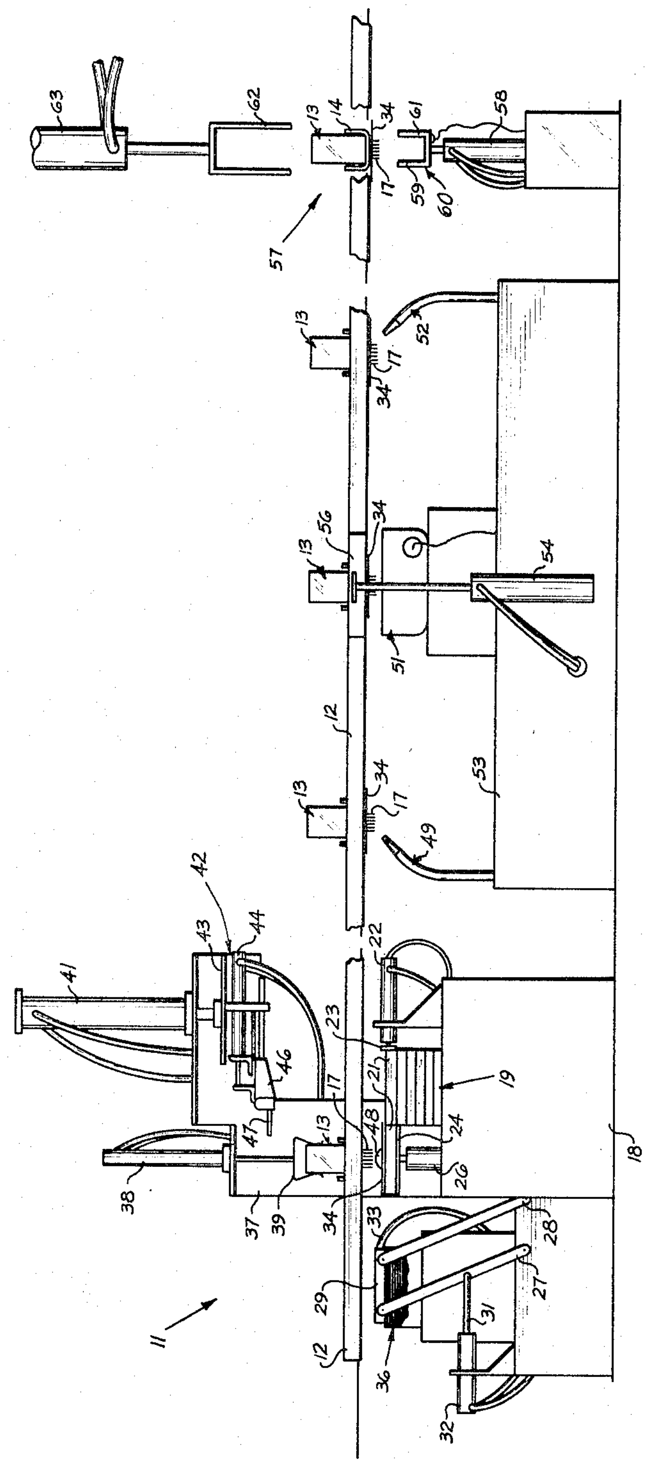
FIG. 1 is a front view of an assembly line for assembling units with printed circuit panels in accordance with the teachings of the invention.
Figure 2:
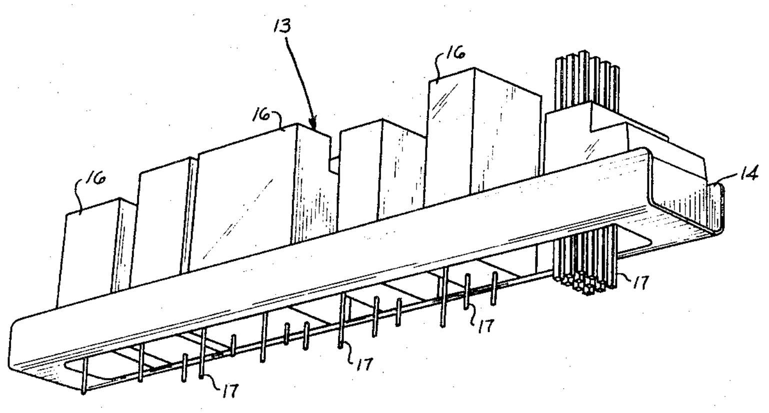
FIG. 2 shows a perspective view of a unit such as a switching unit used in the telephony art.

Referring to FIG. 1, an assembly apparatus designated generally by the reference numeral 11 is provided with a pair of parallel racks 12 (one shown) having latching features for holding and transporting units such as telephone switching units, designated generally by the reference numeral 13 (FIG 2). Each of the units 13, as shown in FIG. 2, is provided with a U-shaped channel 14 supporting a plurality of components 16 having a plurality of fragile terminals 17 which extend downwardly therefrom and project beneath the racks 12—12 (FIG. 1). A housing 18 supports a supply, designated generally by the reference numeral 19, of pads 21, having a gum-like consistency, which are urged upwardly as viewed in FIG. 1. An air cylinder 22, supported on the housing 18, is attached to a pusher 23 which periodically engages the uppermost pad 21 of the pad supply 19 to urge the pad onto a platform 24 which is supported by an air cylinder 26, and thereafter returns to a normal rest position as shown in FIG. 1.

A pair of arms 27 and 28 are pivotally attached to the housing 18 at one end thereof and are attached to a vacuum lift head 29 at the opposite end thereof, wherein the intermediate portion of the arm 27 is connected to a piston rod 31 of an air cylinder 32 to control the pivotal movement of the arms 27 and consequential movement of 28 and the head 29. In addition, the vacuum lift head 29 is connected through a conduit 33 to a vacuum supply source (not shown). Upon actuation of the vacuum supply source, the vacuum lift head 29 vacuumly grips a printed circuit panel 34, such as a flexible printed circuit, from atop a printed circuit supply source, designated generally by the reference numeral 36, wherein the panel has a circuit printed on the underside thereof and a blank surface on the upper side thereof. The carrier for the printed circuit can be made, for example, from polyethylene, a suitable polyester or from such materials as tetrafluoroethylene, sold under the trademark Teflon, and polyethylene terephthalate, sold under the trademark of Mylar.

Thereafter, the air cylinder 32 is actuated to move the vacuum lift head 29 and the gripped printed circuit panel 34 atop the pre-positioned pad 21 in a position wherein the terminals are aligned with land areas on the printed circuit. The vacuum supply is removed and the air cylinder 32 retracts to re-position the vacuum lift head 29 atop the circuit supply 36 whereby the previously gripped printed circuit 34 is deposited atop the pad 21 as previously described.

Referring further to FIG. 1, the racks 12 are thereafter moved to position one of the units 13 spacially above the previously positioned flexible printed circuit 34 and support pad 21. A vertical stand 37 extends upwardly from the housing 18 and supports an air cylinder 38 which controls an overhead clamp 39 for engaging and clamping the unit 13 against the racks 12, whereby the terminals 17 of the unit 13 are aligned with land areas in the printed circuit. In addition, the stand 37 supports an air cylinder 41 which controls a pneumatically operated terminal-supporting apparatus generally designated by the reference numeral 42, which is described in a copending application in the names of H. F. Blair and T. W. Robbins, Ser. No. 249,177, which was filed on Jan. 3, 1963, now Patent No. 3,174,744. Such a terminal-supporting apparatus includes a frame 43 which is supported on the free end of the piston rod which extends from the air cylinder 41. An air cylinder 44 is mounted on the frame 43 and controls the lateral movement of a support 46 wherein the support 46 is provided with a plurality of extended fingers 47.

Subsequent to the clamping of the unit 13 in a position as shown in FIG. 1, the air cylinder 41 is actuated to position the terminal-supporting apparatus 42 adjacent to the terminals 17 of the unit 13. Thereafter, the air cylinder 44 is actuated to position the fingers 47 between the terminals 17 of the clamped unit 13 to support the fragile terminals a predetermined distance from the free ends thereof during the subsequent punching operation, thereby preventing the terminals from deviating from their normal extended alignment with respect to the unit 13. The air cylinder 26 is thereafter actuated to urge the platform 24 toward the terminals 17 so that the terminals engage and are relatively punched through the flexible panel 34 and land areas of the printed circuit formed on the panel. The pad 21 provides a backing for the flexible circuit 34 so that the termianls 17 are embedded in the pad 21 after the punching operation.

The air cylinder 26 is deactuated to lower the platform 24 and strip the pad 21 from the terminals 17, whereby the flexible printed circuit 34 is frictionally retained with the terminals 17 of the unit 13 due to the punching operation. An air cylinder 48 (FIG. 1) is actuated to engage rearwardly and to push the pad 21 substantially horizontally from atop the platform 24 to prepare the platform for the reception of another pad from the pad supply 19 prior to a subsequent punching operation. The air cylinder 44 is deactuated to withdraw the fingers 47 from the area of the terminals 17. In addition, the air cylinders 38 and 41 are deactuated to withdraw the clamp 39 and the terminal-supporting apparatus 42, respectively.

The racks 12 are thereafter actuated to sequentially position the unit 13 adjacent to a fluxing spray unit, designated generally by the reference numeral 49, a solder bath, designated generally by the reference numeral 51, and a flux removing or cleaning spray unit, designated generally by the reference numeral 52. The spray units 49 and 52 and the solder bath 51 are supported on a housing 53, which also supports an air cylinder 54 for controlling a vertically reciprocable rack 56 which is normally positioned in line with the rack 12. As the unit 13 is positioned adjacent to the spray unit 49, a flux is sprayed upon the terminals 17 and the land areas of the printed circuit 34. Thereafter, the unit 13 is positioned on the rack 56 and the air cylinder 54 is actuated to lower the terminals 17 and the printed circuit 34 into the solder bath 51. Subsequently, the air cylinder 54 positions the rack 56 in line with the rack 12, whereupon the unit 13 is transferred to a position adjacent to the spray unit 52. A flux-removing solution is sprayed upon the soldered connection and the rack 12 is moved to position the unit 13 at a forming station, designated generally by the reference numeral 57.

An air cylinder 58 supports a U-shaped frame, designated generally by the reference numeral 60, having a pair of heated edges 59 and 61 which are subsequently positioned beneath the flexible printed circuit 34. Thereafter, an overhead, inverted U-shaped forming element 62 is lowered by the operation of an air cylinder 63 to urge the overhanging portions of the flexible printed circuit 34 against the outer vertical heated edges 59 and 61 of the frame 60 to form the printed circuit in a substantially inverted U-shape relative to the U-shaped channel 14.

Figure 3:
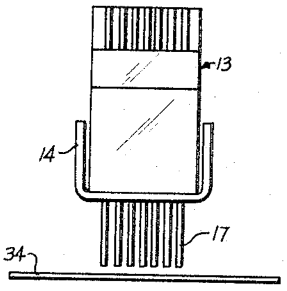
FIGS. 3, 4 and 5 are schematic views showing the step-by-step process of assembling the switching unit as shown in FIG. 2 with a printed circuit and carrier in accordance with the teachings of the invention.
Figure 4:
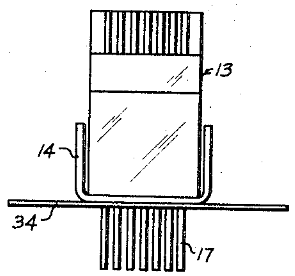
Figure 5:
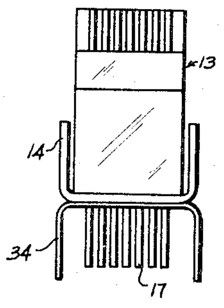

Further, referring to FIGS. 3, 4 and 5, a sequential schematic representation reveals the positioning of the unit 13 so that the terminals 17 extend downwardly toward the flexible printed circuit panel 34. Subsequent movement of the printed circuit panel 34 results in a relative punching through of the terminals 17 into the panel 34 and the land areas of the circuit printed thereon. The printed circuit is thereafter soldered to the terminals 17, and the overhanging portions of the panel 34 are heat-formed in an inverted U-shape by the cooperation of the heated edges 59 and 61 (FIG. 1) and the U-shaped forming element 62 (FIG. 1) as previously described.

Figure 6:
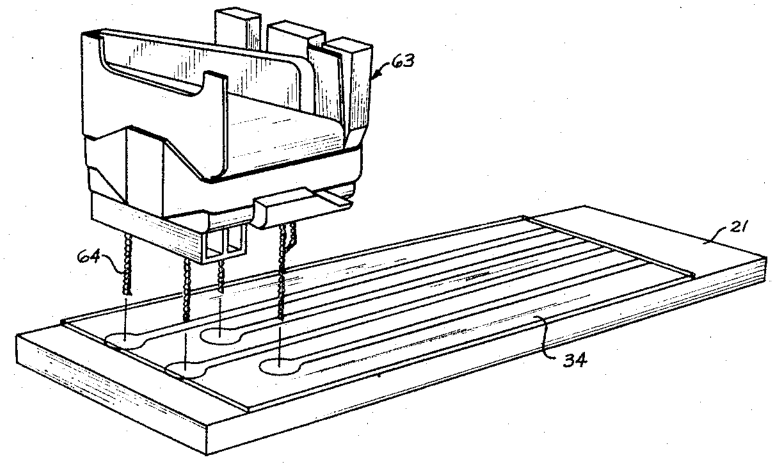
FIG. 6 is a perspective view showing the alignment of a unit having terminals extending toward land areas of a printed circuit panel prior to the insertion of the terminals through the land areas and the panel.
Figure 7:
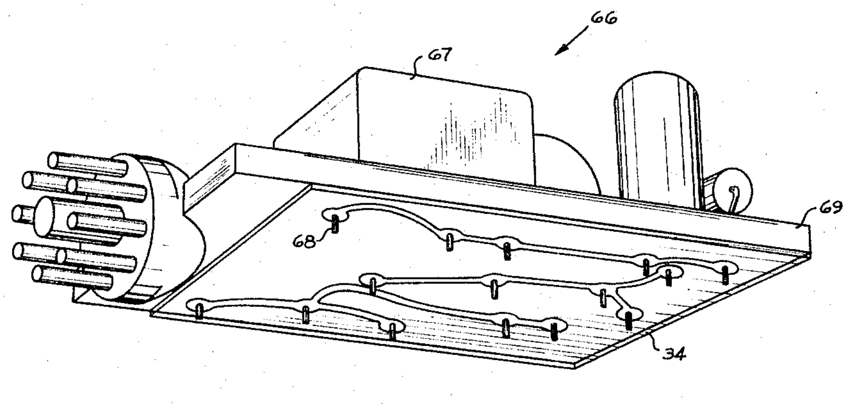
FIG. 7 is a perspective view of a unit having electrical components mounted in a molded plastic support so that the terminals extend from the support with a printed circuit panel assembled therewith subsequent to the assembly process.

As shown in FIGS. 6 and 7, the punching process of assembling units with flexible printed circuit panels is not restricted to units such as the crossbar unit 13, but could be utilized with such a unit, designated generally by the reference numeral 63, having twisted terminals 64 extending downwardly therefrom or terminals having square, round, flat or other configurations. In this instance, as before, the flexible printed circuit panel 34 is supported on the disposable gum-like pad 21 wherein the terminals 64 are aligned with the land areas printed on the panel 34 and are subsequently punched through in a manner previously described. Further, where components, having terminals to be punched through the land areas of the printed circuits, are not supported by a support such as the frame 14, a supporting arrangement is provided in a unit, designated generally by the reference numeral 66, with components 67 having downwardly extending terminals 68, premolded or embedded within a plastic support base 69 a predetermined distance from free ends of the terminals are supported thereby. The free ends of the terminals 68 are subsequently positioned to receive a flexible printed circuit 34 attached thereto by the punching method as previously described.

Figure 8:
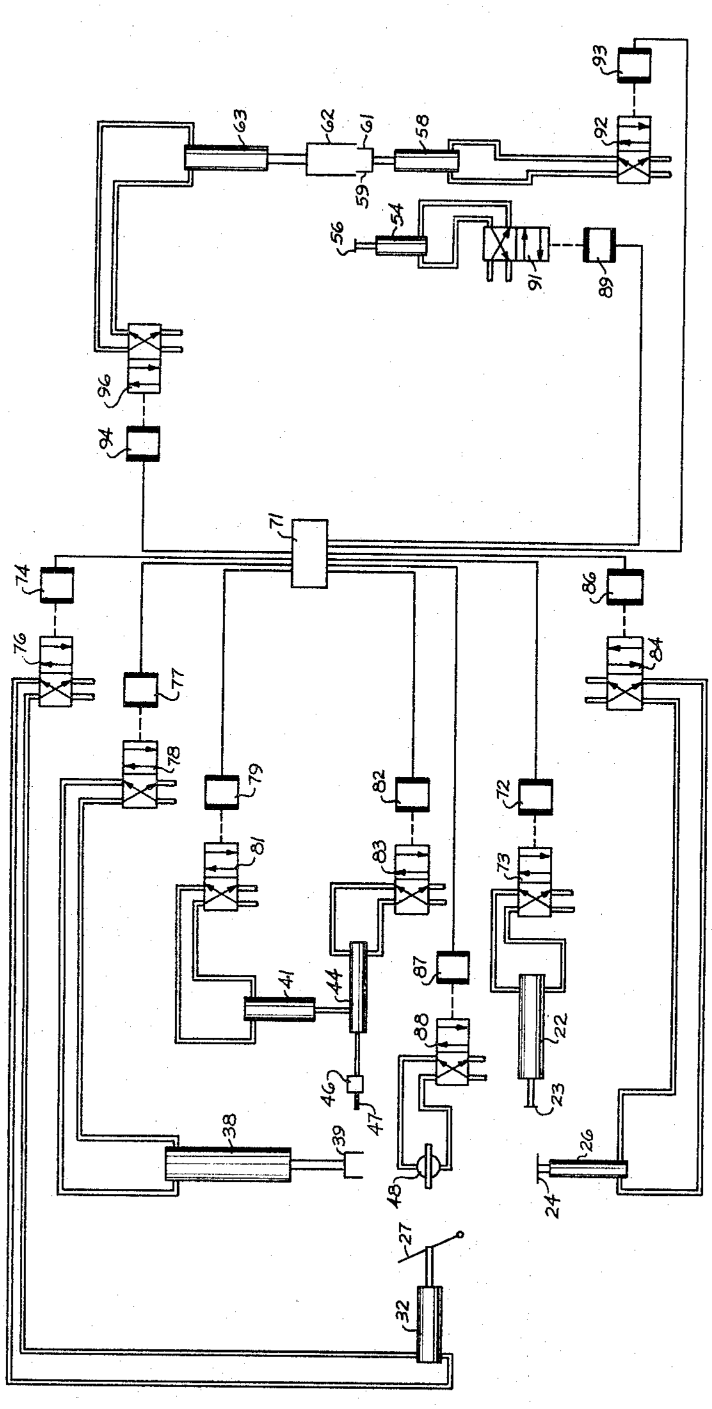
FIG. 8 is a schematic representation of a control system for sequential operation of the air cylinders during the assembly operation.

As shown in FIG. 8, a timer 71 is utilized to control a series of solenoid-controlled valves which are inserted in a supply line between a pneumatic supply (not shown) and the air cylinders utilized in the punch through and subsequent securing operation. Initially, the timer 71 actuates a solenoid 72 to control a valve 73, thereby supplying sufficient pneumatic pressure to the air cylinder 22 to operate the pusher 23, thereby pushing the support pad 21 onto the platform 24. Subsequently, the solenoid 72 is deactuated to retract the valve 73, thereby withdrawing the pusher 23 to a normal rest position as shown in FIG. 1.

The timer 71 then actuates a solenoid 74 to operate a valve 76, thereby controlling the air cylinder 32 to pivot the arms 27 and 28. In this manner, a flexible printed circuit 34 is deposited on the pad 21. The solenoid 74 is thereafter deactuated to withdraw the valve 76 whereby the air cylinder 32 positions the vacuum lift head 29 (FIG. 1) in a normal rest position. The timer 71 then actuates a solenoid 77 to control a valve 78 for supplying pneumatic pressure to the air cylinder 38 so that the clamp 39 engages and clamps the unit 13 against the racks 12.

A solenoid 79 is actuated to operate a valve 81, whereby the air cylinder 41 is operated to position the air cylinder 44, which is supported on the frame 43, in an area adjacent to the terminals 17. The air cylinder 44 is thereafter operated by the actuation of a solenoid 82 which controls the valve 83, whereby the fingers 47 mounted on the support 46 are inserted between the terminals 17 (FIG. 1) to provide the supporting of the terminals as previously described.

A valve 84 is operated by the actuation of a solenoid 86 to operate the air cylinder 26, whereby the platform 24 is urged toward the terminals 17 (FIG. 1) so that the terminals are relatively punched through the flexible printed circuit 34 and into the pad 21. Thereafter, by control of the timer 71, the solenoid 86 is deactuated to operate the valve 84 so that the air cylinder 26 withdraws the platform 24 from the terminals 17, whereby the pad 21 is stripped from the terminals and the flexible printed circuit 34 is frictionally held with the terminals. Thereafter, a solenoid 87 controls a valve 88, whereby the air cylinder 48 is actuated to push the disposable pad 21 from atop the platform 24.

The solenoid 82 is deactuated to operate the valve 83, thereby controlling the air cylinder 44 to withdraw the fingers 47 from an area between the terminals 17. Subsequently, the solenoid 79 is deactuated to operate the valve 81, whereby the air cylinder 41 retracts the frame 43 which supports the air cylinder 44 to a normal rest position as shown in FIG. 1. The timer 71 then deactuates the solenoid 77 to operate the valve 78, whereby the air cylinder 38 detracts the clamp 39 so that the unit 13, having the flexible printed circuit 34 assembled frictionally therewith, is subsequently moved with the rack 12.

In addition to the previously described sequential controlling of the punching operation by the timer 71, a solenoid 89 operates a valve 91 for controlling the air cylinder 54 to position the rack 56 during the soldering operation. A valve 92 is operated through a solenoid 93 for controlling the air cylinder 58 so that the heated edges 59 and 61 are positioned beneath the overhanging portions of the flexible printed circuit 34. Thereafter, a solenoid 94 operates a valve 96 to control the air cylinder 63 so that the inverted U-shaped forming element urges the overhanging portions of the printed circuit 34 against the heated edges 59 and 61 of the frame 60 (FIG. 1). The solenoids 94 and 93 are thereafter sequentially deactuated by the timer 71 to withdraw the U-shaped forming element 62 and the heated edges 59 and 61 from the area of the printed circuit 34.

Utilization of the punching through method of assembly, as previously described, has widespread use, particularly in the area where a large number of units are to be mass-assembled with printed circuit panels. Distinct advantages result in such an operation by overcoming the necessity of preforming an aperture in the land areas of the printed circuits for the reception of the terminals therein. In addition, the relative punching of the terminals through the printed circuit panels results in a friction holding of the panel about the terminals prior to the soldering operation, thereby relieving the necessity of clinching the terminals beneath the panel to insure the retention of the panel about the terminals.

It is to be understood that the above-described processes are simply illustrative of the principles of the invention. Other processes may be devised by those skilled in the art which will embody the principles of the invention and fall within the spirit and scope thereof.

What is claimed is:

1. A method of assembling terminals of a unit with printed circuit panels, which comprises the steps of;
   - positioning a support pad on a platform,
   - positioning a flexible printed circuit on the support pad,
   - supporting the unit so that the terminals of the unit are aligned spacially with land areas of the printed circuit, and
   - moving relatively the platform and the extended terminals of the unit together, whereby the terminals punch through the panel and the land areas of the flexible printed cicruit and into the support pad.

2. A method of assembling terminals of a unit with printed circuit panels, which comprises the steps of;
   - positioning a support pad on a patform,
   - positioning a flexible printed circuit on the support pad,

- supporting the unit so that the terminals of the unit are aligned spacially with land areas of the printed circuit,
   - moving relatively the platform and the extended terminals of the unit together, whereby the terminals punch through the panel and the land areas of the flexible printed circuit and into the support pad, and
   - stripping the support pad from the terminals, whereby the flexible printed circuit is held frictionally and assembled with the terminals of the unit.

3. A method of assembling and securing fragile termials of a unit of a flexible printed circuit panel, which comprises the steps of;
   - positioning the flexible printed circuit panel on a solid gum-like support pad,
   - supporting the unit in a fixed position, whereby free ends of the terminals of the unit are aligned spacially with land areas of the printed circuit,
   - positioning terminal-supporting apparatus about the fragile terminals adjacent to the unit body with the free ends extending a predetermined distance beyond the supporting apparatus,
   - moving the support pad with the flexible printed circuit panel and the supported terminal together, whereby the terminals are punched through the panel and the land areas of the printed circuit and into the support pad,
   - separating the unit-supporting and the terminal-supporting apparatus from the unit,
   - stripping the support pad from the terminals,
   - soldering the land areas having terminals punched therethrough, whereby the terminals are rigidly secured to the flexible printed circuit, and
   - heat-forming portions of the flexible panel to a desired configuration.

References Cited

UNITED STATES PATENTS

| | | | |
|---|---|---|---|
| 2,880,378 | 3/1959 | Lindseth | 29—155.5 X |
| 2,962,801 | 12/1960 | Cass | 29—155.5 |
| 2,994,058 | 7/1961 | Dahlgren | 174—68.5 X |
| 3,076,230 | 2/1963 | Parker | 29—155.5 X |
| 3,157,733 | 11/1964 | Demasi | 339—17 X |
| 3,263,023 | 7/1966 | Staley | 174—68.5 |

FOREIGN PATENTS

| | | |
|---|---|---|
| 646,715 | 8/1962 | Canada. |
| 753,875 | 8/1956 | Great Britain. |

JOHN F. CAMPBELL, *Primary Examiner*.

J. CLINE, C. I. SHERMAN, *Assistant Examiners*.